United States Patent
Araoka et al.

(10) Patent No.: US 10,163,637 B2
(45) Date of Patent: Dec. 25, 2018

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki-shi, Kanagawa (JP)

(72) Inventors: Tsuyoshi Araoka, Tsukuba (JP); Youichi Makifuchi, Tachikawa (JP); Masaki Miyazato, Tsukuba (JP); Takashi Tsutsumi, Matsumoto (JP); Mitsuo Okamoto, Tsukuba (JP); Kenji Fukuda, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/691,107

(22) Filed: Aug. 30, 2017

(65) Prior Publication Data
US 2018/0090320 A1 Mar. 29, 2018

(30) Foreign Application Priority Data
Sep. 29, 2016 (JP) .................................. 2016-191295

(51) Int. Cl.
*H01L 21/425* (2006.01)
*H01L 21/04* (2006.01)
(Continued)

(52) U.S. Cl.
CPC .......... *H01L 21/045* (2013.01); *H01L 21/049* (2013.01); *H01L 29/1608* (2013.01);
(Continued)

(58) Field of Classification Search
CPC ................. H01L 21/045; H01L 21/049; H01L 21/02529; H01L 29/1608; H01L 29/36; H01L 29/66068; H01L 29/6606
See application file for complete search history.

(56) References Cited

U.S. PATENT DOCUMENTS

| 5,030,580 A * | 7/1991 | Furukawa ............. H01L 21/046 |
| | | 257/E21.057 |
| 2016/0247884 A1* | 8/2016 | Ohashi ................ H01L 29/1608 |

FOREIGN PATENT DOCUMENTS

| JP | H07-240409 A | 9/1995 |
| JP | 2014-103175 A | 6/2014 |

OTHER PUBLICATIONS

G. Y. Chung et al., "Effect of nitric oxide annealing on the interface trap densities near the band edges in the 4H polytype of silicon carbide", Applied Physics Letters, vol. 76, No. 13, pp. 1713-1715, Mar. 27, 2000.

* cited by examiner

Primary Examiner — Hsien Ming Lee
(74) Attorney, Agent, or Firm — Rabin & Berdo, P.C.

(57) ABSTRACT

A silicon carbide semiconductor device, including a silicon carbide semiconductor substrate, and an insulating film formed on a front surface of the silicon carbide semiconductor substrate. The silicon carbide semiconductor substrate has fluorine implanted therein, a concentration of which is in a range of $2 \times 10^{17}/cm^3$ to $4 \times 10^{18}/cm^3$. A method of manufacturing the silicon carbide semiconductor device includes providing a silicon carbide semiconductor substrate, forming an oxide film on a front surface of the silicon carbide semiconductor substrate, removing a portion of the oxide film to expose the silicon carbide semiconductor substrate, implanting fluorine ions in the front surface of the silicon carbide semiconductor substrate through the
(Continued)

removed portion of the oxide film, removing the oxide film after the fluorine ions are implanted, and forming an insulating film on the front surface of the silicon carbide semiconductor substrate after the oxide film is removed.

12 Claims, 12 Drawing Sheets

(51) Int. Cl.
    *H01L 29/16*     (2006.01)
    *H01L 29/36*     (2006.01)
    *H01L 29/51*     (2006.01)
    *H01L 29/66*     (2006.01)
    *H01L 29/94*     (2006.01)
    *H01L 29/78*     (2006.01)
    *H01L 21/66*     (2006.01)

(52) U.S. Cl.
    CPC .............. *H01L 29/36* (2013.01); *H01L 29/51* (2013.01); *H01L 29/6606* (2013.01); *H01L 29/66068* (2013.01); *H01L 29/66568* (2013.01); *H01L 29/94* (2013.01); *H01L 22/14* (2013.01); *H01L 29/7802* (2013.01)

FIG.17

| | ACCELERATION ENERGY | DOSE AMOUNT | EFFECT |
|---|---|---|---|
| EXISTING METHOD | 50 keV OR MORE | $5 \times 10^{14}/cm^2$ OR MORE | INTERFACE DETERIORATION, ENHANCED OXIDATION |
| PRESENT EXAMPLE | 30 keV OR LESS | LESS THAN $2 \times 10^{13}/cm^2$ | INTERFACE IMPROVEMENT |

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2016-191295, filed on Sep. 29, 2016, the entire contents of which are incorporated herein by reference.

BACKGROUND OF THE INVENTION

1. Field of the Invention

Embodiments of the present invention relate to a silicon carbide semiconductor device and a method of manufacturing a silicon carbide semiconductor device.

2. Description of the Related Art

Silicon carbide (SiC) has a high physical property value. Therefore, utilizing this property, applications of silicon carbide to high-voltage power devices with low loss is expected. When silicon carbide is applied to a silicon-carbide vertical metal oxide semiconductor field effect transistor (MOSFET), which is one type of silicon carbide semiconductor device, a gate insulating film such as silicon dioxide ($SiO_2$) is formed on the silicon carbide.

To form silicon dioxide on silicon carbide, a method of thermally oxidizing the silicon carbide or a method of depositing a silicon dioxide film on the silicon carbide is used. Whichever method is used, an interface state is produced at an interface between the silicon carbide and the silicon dioxide. This interface state may reduce the field effect mobility (channel mobility) of the MOSFET as compared to the mobility in a silicon carbide bulk, which may increase the resistance value of the MOSFET in an ON state, resulting in increased loss.

Interface state density is used as an index for evaluating the characteristics of the interface between silicon carbide and silicon dioxide. Generally, there is a tendency that the interface characteristics become higher and the channel mobility increases as the interface state density near a conduction band decreases.

Regarding the interface state density described above, when a thin film of silicon dioxide is to be formed by thermal oxidation on one of principal surfaces of silicon carbide, for example, excessive carbon (C) atoms or unbonded atoms called "dangling bonds" are sometimes formed in a region near the interface between silicon carbide and silicon dioxide during oxidation. Because there may be many dangling bonds and the like as the interface state, the interface state density may increase in some cases. It is known that the interface state is a factor that reduces the channel mobility of a semiconductor device using silicon carbide and increases the loss.

To address this problem, there is, for example, a technique that enables reduction of the interface state density by forming a thin film of silicon dioxide by normal thermal oxidation processing and performing heat treatment in a nitric oxide (NO) atmosphere (for example, see G. Y. Chung, et al, "Effect of nitric oxide annealing on the interface trap densities near the band edges in the 4H polytype of silicon carbide", APPLIED PHYSICS LETTERS, Vol. 76, (USA), 2000 Mar. 27, p. 171).

Introduction of halogen elements having an effect to terminate dangling bonds or remove compounds of carbon is also examined. For example, there is a technique that enables reduction of the interface state density at an interface between a silicon carbide semiconductor substrate and an insulating film by performing heat treatment in a halogen atmosphere such as fluorine (F) or chlorine (Cl) to remove carbon atoms from a vicinity of an interface between silicon carbide and the insulating film or from the insulating film, or keeping carbon atoms away from a vicinity of the interface between the silicon carbide semiconductor substrate and the insulating film (for example, see Japanese Laid-Open Patent Publication No. 2014-103175).

A method of introducing elements into an oxide film interface using methods other than heat treatment is also examined and there is, for example, a technique that enables enhanced oxidation to be used for element isolation or the like by performing implantation under a condition where the acceleration energy is equal to or higher than 50 keV and the dose is equal to or more than $5\times10^{14}/cm^2$ and thereafter performing thermal oxidation processing (for example, see Japanese Laid-Open Patent Publication No. H07-240409).

SUMMARY OF THE INVENTION

According to one aspect of the present invention, a silicon carbide semiconductor device includes a silicon carbide semiconductor substrate of a first conductivity type; and an insulating film provided on a front surface of the silicon carbide semiconductor substrate. A concentration of fluorine in the silicon carbide semiconductor substrate is $2\times10^{17}/cm^3$ to $4\times10^{18}/cm^3$.

According to another aspect of the present invention, a method of manufacturing a silicon carbide semiconductor device includes forming an oxide film on a front surface of a silicon carbide semiconductor substrate; implanting fluorine ions in a surface of the silicon carbide semiconductor substrate having the oxide film formed thereon; removing the oxide film after the fluorine ions are implanted; and forming an insulating film on the front surface of the silicon carbide semiconductor substrate after the oxide film is removed.

In the method, forming the oxide film is a process of forming on the front surface of the silicon carbide semiconductor substrate, a silicon dioxide film having a film thickness of 5 nanometers to less than 15 nanometers.

In the method, the fluorine ions are implanted so that a concentration of fluorine in the silicon carbide semiconductor substrate becomes $2\times10^{17}/cm^3$ to $4\times10^{18}/cm^3$.

In the method, forming the insulating film includes forming a silicon dioxide film on the front surface of the silicon carbide semiconductor substrate after the oxide film is removed.

In the method, forming the insulating film includes forming the silicon dioxide film by thermal oxidization in dry oxygen containing no moisture.

In the method, forming the insulating film includes forming the silicon dioxide film by thermal oxidation in gas containing at least moisture.

In the method, forming the insulating film includes forming the silicon dioxide film by thermal oxynitriding in an atmosphere containing at least one type of gas among nitric oxide gas, nitrous oxide gas, and nitrogen dioxide gas.

In the method, forming the insulating film includes forming the silicon dioxide film by deposition by a chemical vapor deposition method.

In the method, forming the insulating film further includes heat treating the silicon carbide semiconductor substrate in dry oxygen gas containing no moisture, after the silicon dioxide film is deposited.

In the method, forming the insulating film further includes heat treating the silicon carbide semiconductor substrate with gas containing at least moisture, after the silicon dioxide film is deposited.

In the method, forming the insulating film further includes heat treating the silicon carbide semiconductor substrate in an atmosphere containing at least one type of gas among nitric oxide gas, nitrous oxide gas, and nitrogen dioxide gas, after the silicon dioxide film is deposited.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 17 is a diagram depicting a difference between the manufacturing method according to the first example and an existing manufacturing method;

DETAILED DESCRIPTION OF THE INVENTION

Figure 1:
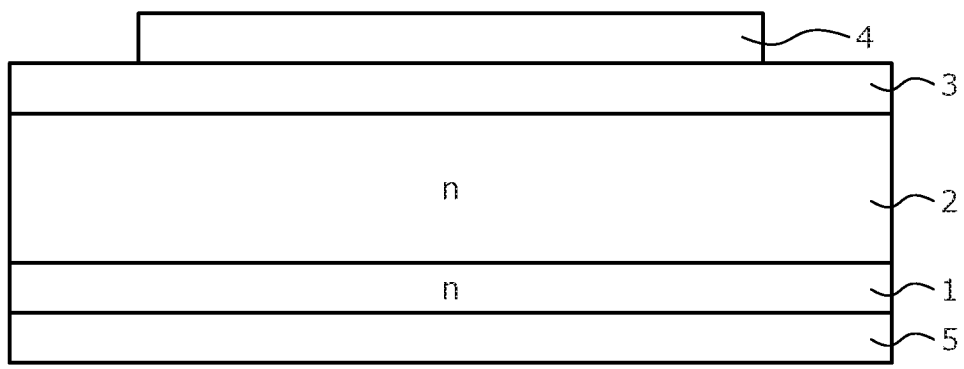
FIG. 1 is a cross-sectional view depicting a configuration of a MOS capacitor according to an embodiment.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

A conventional method that is directed to reduce the interface state density in a region near an interface between silicon carbide and a silicon dioxide thin film by performing heat treatment in a NO atmosphere, which is described by G. Y. Chung, et al in "Effect of nitric oxide annealing on the interface trap densities near the band edges in the 4H polytype of silicon carbide" cited above, is based on, for example, the density of dangling bonds, which are caused by excessive C atoms in silicon carbide, being reduced by termination of dangling bonds with nitrogen (N) atoms in NO gas having a closer atomic radius to that of carbon. For example, in an energy region near a conduction band of silicon carbide, the interface state density may be significantly reduced by performing heat treatment in an NO atmosphere as described in Japanese Laid-Open Patent Publication No. 2014-103175, as compared to a case where the heat treatment in a NO atmosphere is not performed.

However, according to G. Y. Chung, et al, by performing the heat treatment in a NO atmosphere, the interface state density in an energy region near a valence band is conversely increased as compared to a case where the heat treatment in a NO atmosphere is not performed. G. Y. Chung, et al describe a result of heat treatment at 1150 degrees C. while NO gas is flowed by 0.5 liters per minute under 1 atmospheric pressure. However, the interface state density is not sufficiently reduced as described above. Therefore, a method of introducing an element other than nitrogen into an oxide film interface is required.

In the case of Japanese Laid-Open Patent Publication No. 2014-103175 cited above, the inventors confirmed that, because the concentration of halogen compounds in an atmosphere was low and 0.02%, the improvement effect was insufficient and the interface state density in the energy region near the valence band could not be improved while the interface state density in the energy region near the conduction band could be improved.

In the case of Japanese Laid-Open Patent Publication No. H07-240409 cited above, an oxide film interface is damaged at the time of implantation because the implantation energy is high and high-density dopants are implanted. Therefore, there is an influence that the interface state densities in the energy regions near the conduction band and the valence band are deteriorated.

The interface state density in the energy region near the valence band acts as hole traps and a threshold voltage fluctuates due to trapped holes when there are many hole traps. Particularly when there are hole traps exceeding $5\times10^{12}/cm^2$, the operation of a semiconductor device becomes significantly unstable.

Here, in an embodiment, a silicon carbide semiconductor device is described using a configuration of a MOS capacitor as an example. FIG. 1 is a cross-sectional view depicting a configuration of a MOS capacitor according to the embodiment. As depicted in FIG. 1, the MOS capacitor according to the embodiment has an n-type epitaxial film 2 deposited on a first main surface (the front surface) of an n-type silicon carbide substrate (the silicon carbide semiconductor substrate of a first conductivity type) 1.

The n-type silicon carbide substrate 1 is, for example, a silicon carbide single-crystal substrate doped with nitrogen (N). The n-type epitaxial film 2 is a low-concentration n-type drift layer doped with, for example, nitrogen and has a lower impurity concentration than that of the n-type silicon carbide substrate 1. Hereinafter, the n-type silicon carbide substrate 1 and the n-type epitaxial film 2 are collectively referred to as "silicon carbide semiconductor base".

Ions of fluorine (F) are implanted in the n-type silicon carbide substrate 1 and the concentration of fluorine is, for example, $2 \times 10^{17}/cm^3$ to $4 \times 10^{18}/cm^3$. Dangling bonds in an interface, which are reported as a factor of the interface state, are terminated by the fluorine and compounds of carbon segregated in the interface are also removed thereby. This may reduce the interface state between a silicon carbide layer and a gate insulating film.

An aluminum gate electrode 4 containing aluminum (Al) is provided on a portion of a surface on a first side of an insulating film 3 opposite a second side of the insulating film facing toward the n-type silicon carbide substrate 1. An aluminum rear electrode 5, which is formed by vapor deposition of aluminum, is provided on a second main surface (a back surface) of the n-type silicon carbide substrate 1.

Figure 2:
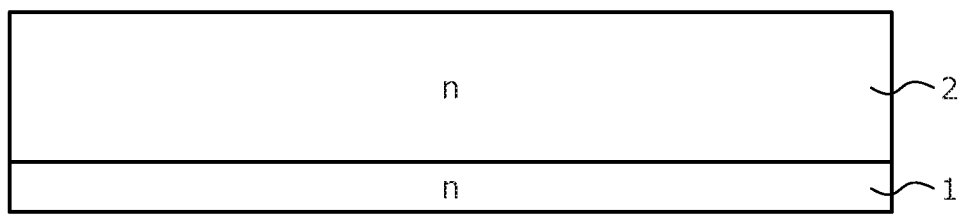
FIGS. 2 and 3 are cross-sectional views depicting states of the MOS capacitor according to the embodiment during manufacturing.
Figure 3:
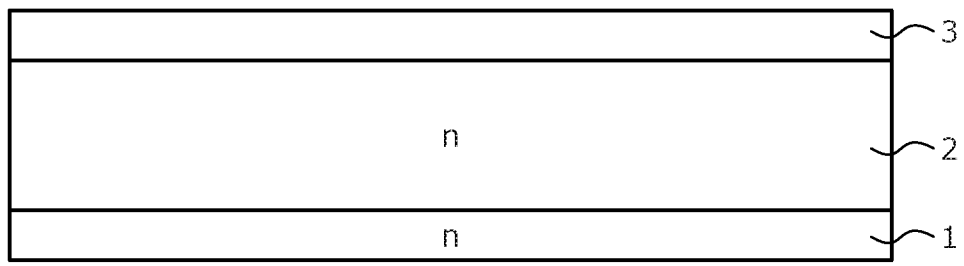

A method of manufacturing the MOS capacitor according to the embodiment is described next. FIGS. 2 and 3 are cross-sectional views depicting states of the MOS capacitor according to the embodiment during manufacturing.

In a first process, an n-type 4H—SiC (four-layer periodic hexagonal silicon carbide) substrate is prepared as the n-type silicon carbide substrate 1. An n-type epitaxial film 2 with a donor density of about $1.0 \times 10^{16}/cm^3$ is grown to 5 to 10 micrometers on the n-type 4H—SiC (000-1) substrate (a substrate that is 0 to 8 degrees off with respect to the (000-1) plane). The state up to here is depicted in FIG. 2. The simple 4H—SiC substrate or a combination of the 4H—SiC substrate and the n-type epitaxial film 2 is referred to as "4H—SiC semiconductor".

Next, in a second process, after the 4H—SiC semiconductor is cleaned, fluorine ions are implanted. The implantation is performed under conditions where the acceleration energy is 30 keV and the dose is $5.0 \times 10^{12}/cm^2$ or $2.0 \times 10^{13}/cm^2$. A sacrificial oxide film (not depicted) may be formed of, for example, a silicon dioxide film of 5 nanometers or more and less than 15 nanometers before the fluorine ions are implanted, and the sacrificial oxide film may be removed after the fluorine ions are implanted.

Next, in a third process, after the 4H—SiC semiconductor is cleaned again, thermal oxidation processing is performed in a dry oxygen ($O_2$) atmosphere to form the insulating film 3 having a thickness of 10, 40, or 70 nanometers. At this time, it suffices that the oxidation temperature is 800 degrees C. or higher. In particular, the temperature may be, for example, 1000 degrees C. to 1300 degrees C. at which the oxidation rate is easily controlled. The insulating film 3 may be alternatively formed by thermal oxynitriding in an atmosphere containing at least one type of gas among nitric oxide gas, nitrous oxide ($N_2O$) gas, and nitrogen dioxide ($NO_2$) gas. The state up to here is depicted in FIG. 3.

Next, in a fourth process, a MOS capacitor having a dotted aluminum gate electrode 4 vapor-deposited at a room temperature on the insulating film 3 and having an aluminum rear electrode 5 formed by vapor-depositing aluminum on the entire back surface was fabricated and thus, the MOS capacitor depicted in FIG. 1 is fabricated (manufactured).

Figure 4:
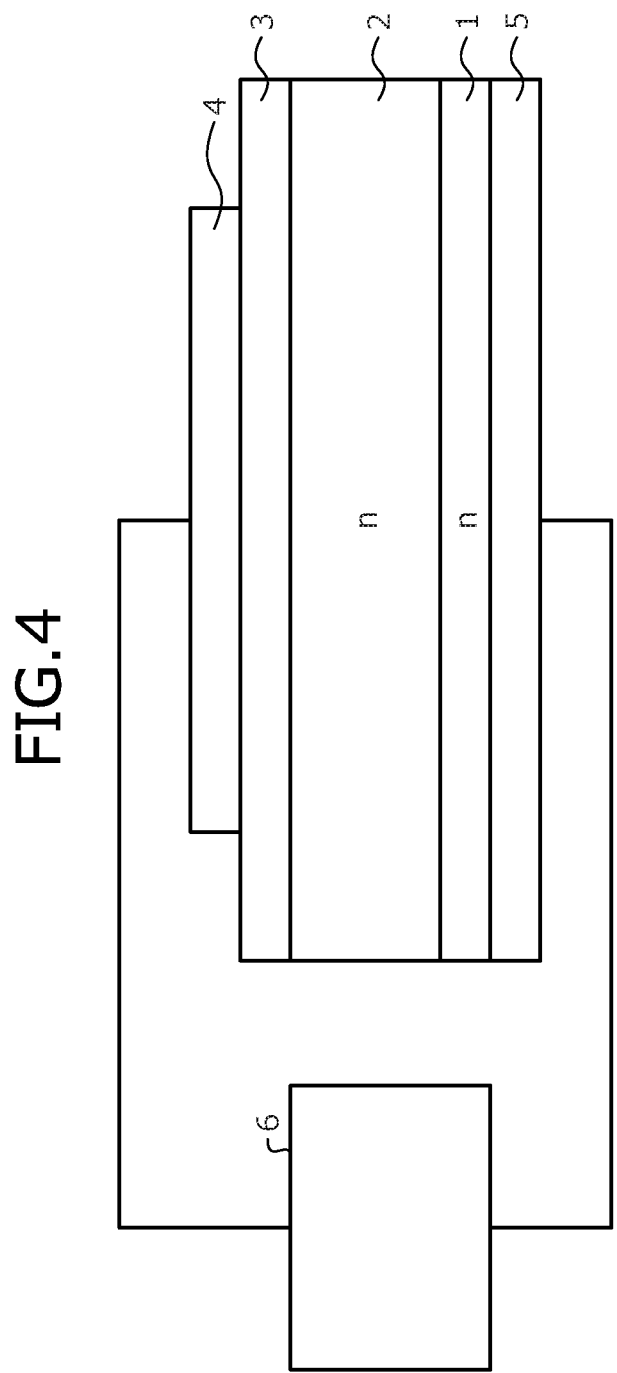
FIG. 4 is a diagram depicting measurement of interface state density of the MOS capacitor.

A manner by which the present invention reduces the interface state density was examined next. To examine a control effect on a MOS interface according to the present invention, a MOS capacitor was fabricated without performing the second process as a comparative example. FIG. 4 is a diagram depicting measurement of the interface state density of the MOS capacitor. As depicted in FIG. 4, the completed MOS capacitor was measured with a capacitance-voltage (C-V) meter 6 to calculate the interface state density for comparison.

Figure 5:
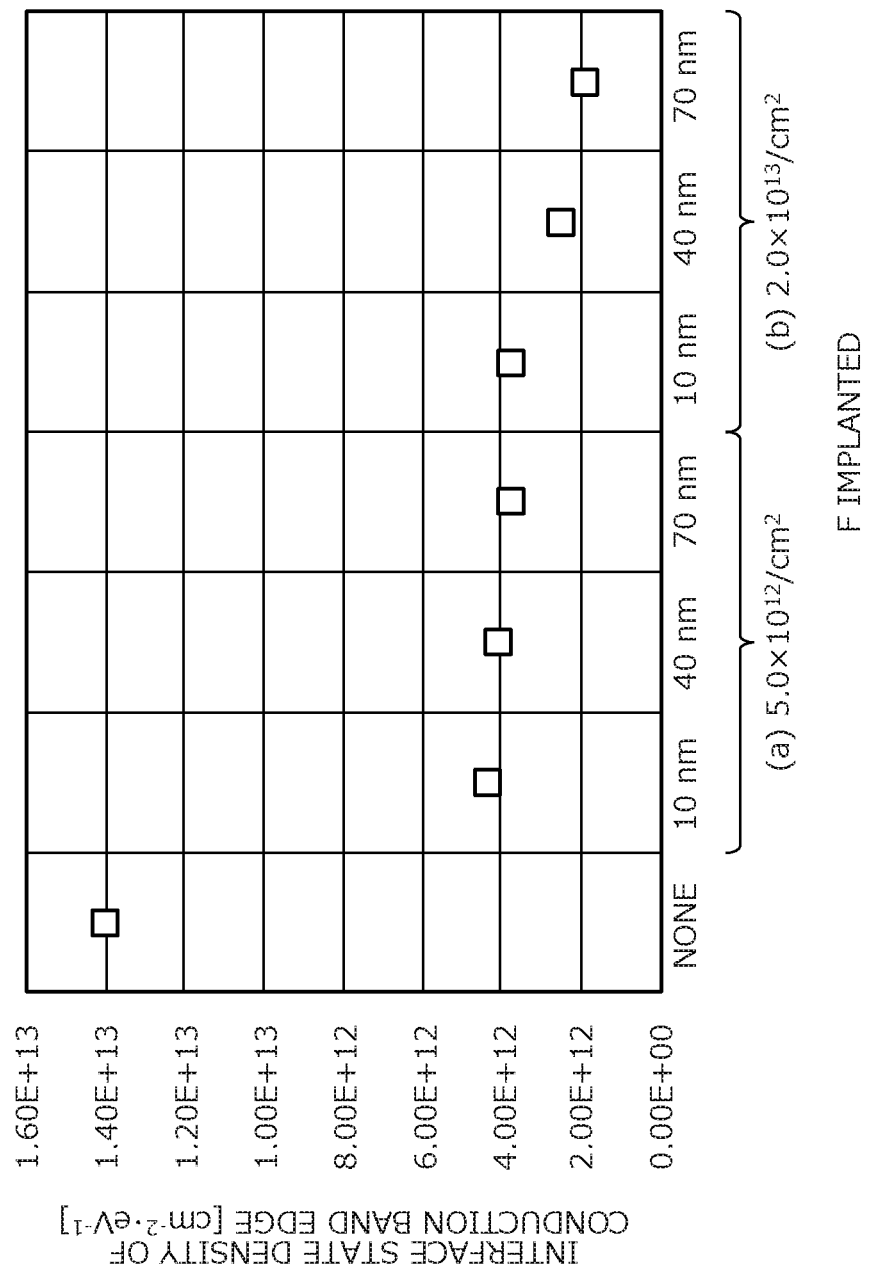
FIG. 5 is a diagram depicting the interface state densities obtained from measurement results of the MOS capacitor according to the embodiment and a MOS capacitor fabricated for comparison.

FIG. 5 is a diagram depicting the interface state densities obtained from measurement results of the MOS capacitor according to the embodiment and the MOS capacitor fabricated for comparison, respectively.

In FIG. 5, "none" represents the interface state density of the comparative example in which fluorine was not implanted, (a) represents the interface state densities of an example in which fluorine was implanted at a dose of $5.0 \times 10^{12}/cm^2$, and (b) represents interface state densities of an example in which fluorine was implanted at a dose of $2.0 \times 10^{13}/cm^2$. For each of the conditions (a) and (b), the interface state densities in cases where the thickness of the insulating film 3 is 10, 40, and 70 nanometers were measured.

As depicted in FIG. 5, it is understood that the interface state densities are greatly reduced in the cases where fluorine implantation was performed as compared to the case where no fluorine implantation was performed. It is presumed that this large reduction is an effect of termination of dangling bonds located in the interface with fluorine, degradation of compounds of carbon present in the interface with fluorine, and reduction of implantation damage by a sacrificial oxide film.

Next, a silicon carbide MOSFET was fabricated as an example of the present invention, and the channel mobility and the quantity of hole traps were evaluated as characteristics of the silicon carbide MOSFET.

The fabricated example of the present invention is described next with reference to FIGS. 6 to 15. FIGS. 6, 7, 8, 9, 10, 11, 12, 13, 14, and 15 are cross-sectional views depicting states of a MOSFET according to a first example during manufacturing. FIGS. 6 to 15 are cross-sectional views at respective processes for explaining first to tenth processes during manufacturing a MOSFET on the (000-1) plane of silicon carbide.

Figure 6:
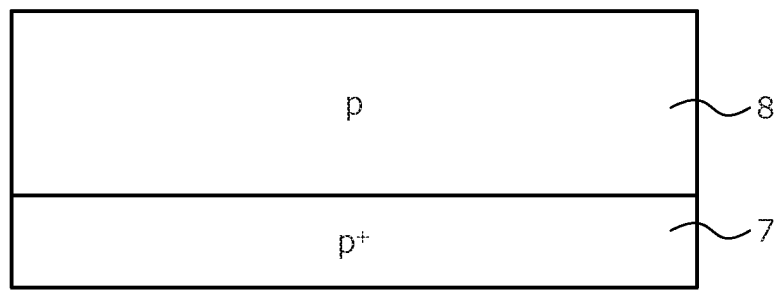
FIGS. 6, 7, 8, 9, 10, 11, 12, 13, 14, and 15 are cross-sectional views depicting states of a MOSFET according to a first example during manufacturing.

First, as depicted in FIG. 6, in the first process, a p-type epitaxial film 8 with an acceptor density of $1 \times 10^{16}/cm^3$ is grown on a p$^+$-type 4H—SiC (000-1) substrate 7 (a substrate that is 0 to 8 degrees off and may be, for example, 0 to 4 degrees off with respect to the (000-1) plane).

Figure 7:
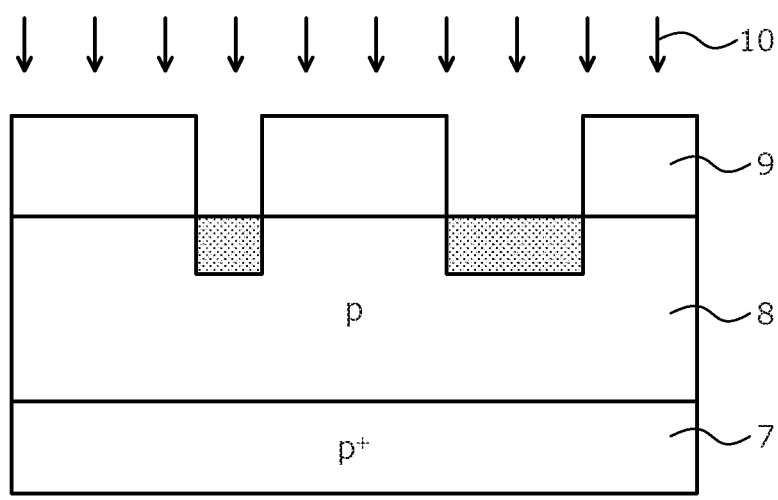

Next, as depicted in FIG. 7, in the second process, a silicon dioxide film with a thickness of 1 micrometer is deposited on a surface of the p-type epitaxial film 8 by a low-pressure chemical vapor deposition (CVD) method and is patterned by photolithography to form a mask 9. Subsequently, for example, phosphorus (P) ions 10 are implanted by multistage ion implantation at a substrate temperature of 500 degrees C. and an acceleration energy of 40 keV to 250 keV to obtain an impurity concentration of $2 \times 10^{20}/cm^3$. In FIG. 7, regions in which the phosphorus ions are implanted are hatched regions.

Figure 8:
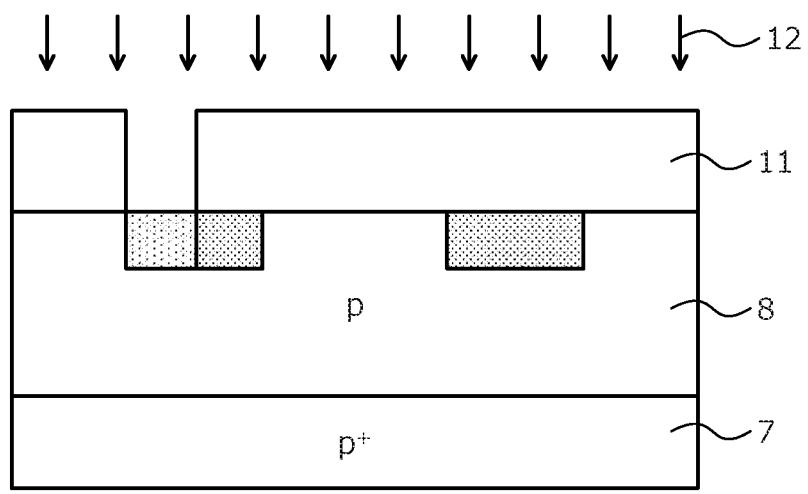

Next, as depicted in FIG. 8, in the third process, the mask 9 is removed and a $SiO_2$ film with a thickness of 1 micrometer is deposited on the surface by the low-pressure CVD method and is patterned by photolithography to form a mask 11. Subsequently, for example, aluminum (Al) ions 12 are implanted by multistage ion implantation at a substrate temperature of 500 degrees C. and an acceleration energy of 40 keV to 200 keV to obtain an impurity concentration of $2 \times 10^{20}/cm^3$. In FIG. 8, a region in which the aluminum ions are implanted is a region hatched more lightly than the regions in which the phosphorous ions are implanted.

Figure 9:
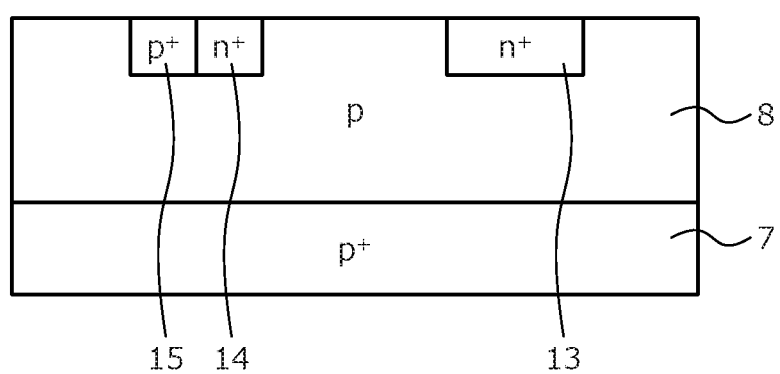

Next, as depicted in FIG. 9, in the fourth process, the mask 11 is removed and activation annealing is performed at 1600 degrees C. for 5 minutes in an argon (Ar) atmosphere to form an n$^+$-type drain region 13, an n$^+$-type source region 14, and a p$^+$-type ground region 15.

Figure 10:
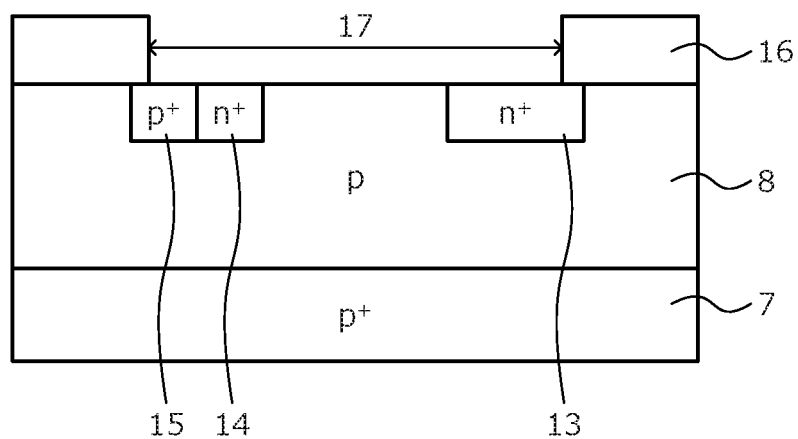

Next, as depicted in FIG. 10, in the fifth process, a field oxide film 16 with a thickness of 0.5 micrometers is deposited by the low-pressure CVD method and a portion of the field oxide film 16 is removed by photolithography and wet etching to form an active region 17.

Figure 11:
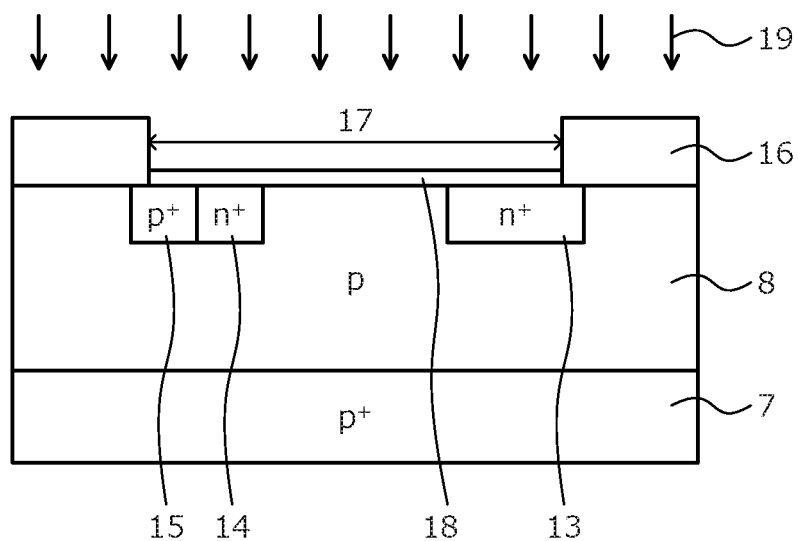

Next, as depicted in FIG. 11, in the sixth process, a sacrificial oxide film 18 of 15 nanometers is formed by heat treatment in a dry oxygen atmosphere and then fluorine ions 19 are implanted therein. The implantation is performed under conditions where the acceleration energy is 30 keV and the dose is $5.0 \times 10^{12}$/cm$^2$ or $2.0 \times 10^{13}$/cm$^2$.

Figure 12:
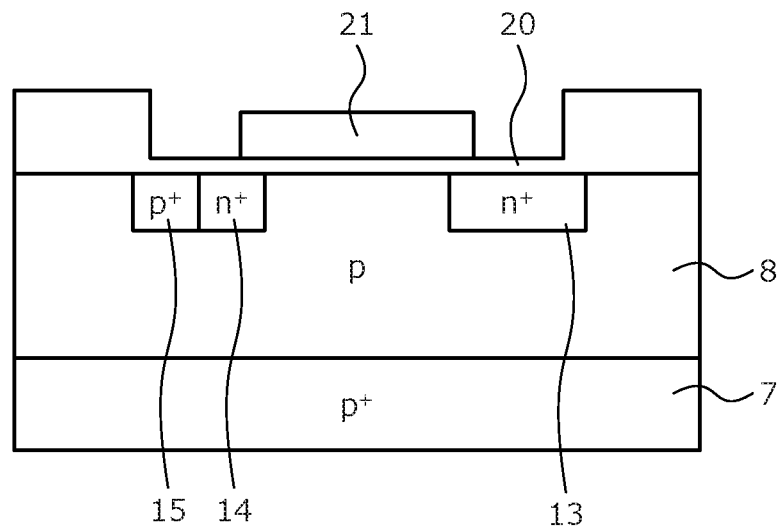

Next, as depicted in FIG. 12, in the seventh process, the sacrificial oxide film 18 is removed by hydrogen fluoride (HF), cleaning is performed again, and thereafter thermal oxidation is performed in a dry oxygen atmosphere to form a gate insulating film 20 having a thickness of 10, 40, or 70 nanometers. At this time, it suffices that the oxidation temperature is equal to or higher than 800 degrees C. In particularly, the oxidation temperature may be, for example, 1000 degrees C. to 1300 degrees C. at which the oxidation rate is easily controlled. Thereafter, poly-silicon having a thickness of 0.3 micrometers is deposited on the gate insulating film 20 by the low-pressure CVD method and is patterned by photolithography to form a gate electrode 21.

Figure 13:
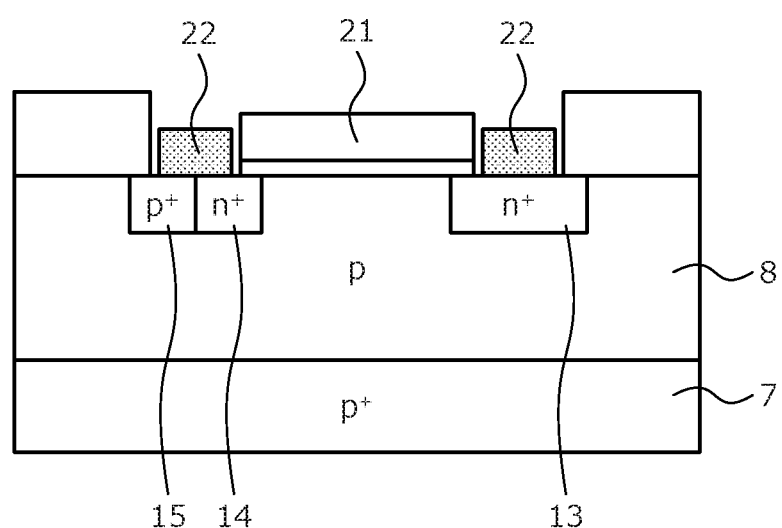

Next, as depicted in FIG. 13, in the eighth process, contact holes are formed by photolithography and hydrofluoric acid (HF) etching on the n$^+$-type drain region 13, the n$^+$-type source region 14, and the p$^+$-type ground region 15, and aluminum having a thickness of 10 nanometers and then nickel (Ni) having a thickness of 60 nanometers are vapor-deposited thereon one on top of the other and are patterned by lift-off to form contact metals 22.

Figure 14:
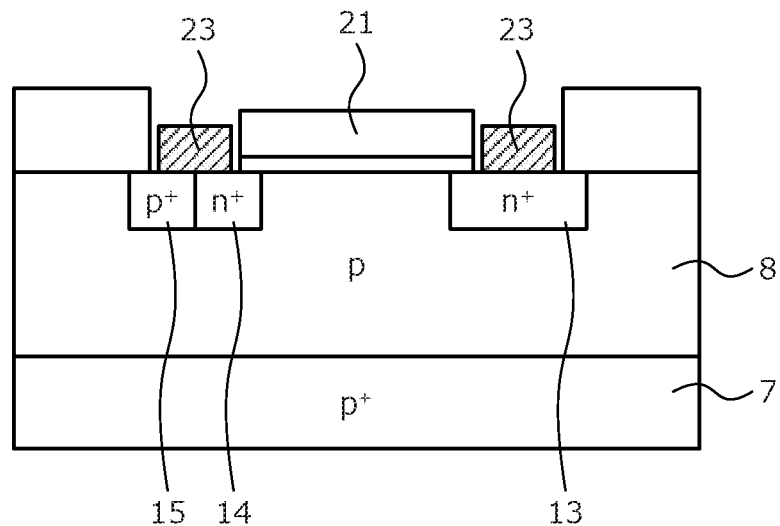

Next, as depicted in FIG. 14, in the ninth process, annealing is performed as ohmic contact annealing in an inert gas atmosphere where 950 degrees C. is kept for 2 minutes to form reactive layers 23 of the contact metals 22 and SiC. The inert gas is any of nitrogen, helium (He), and argon.

Figure 15:
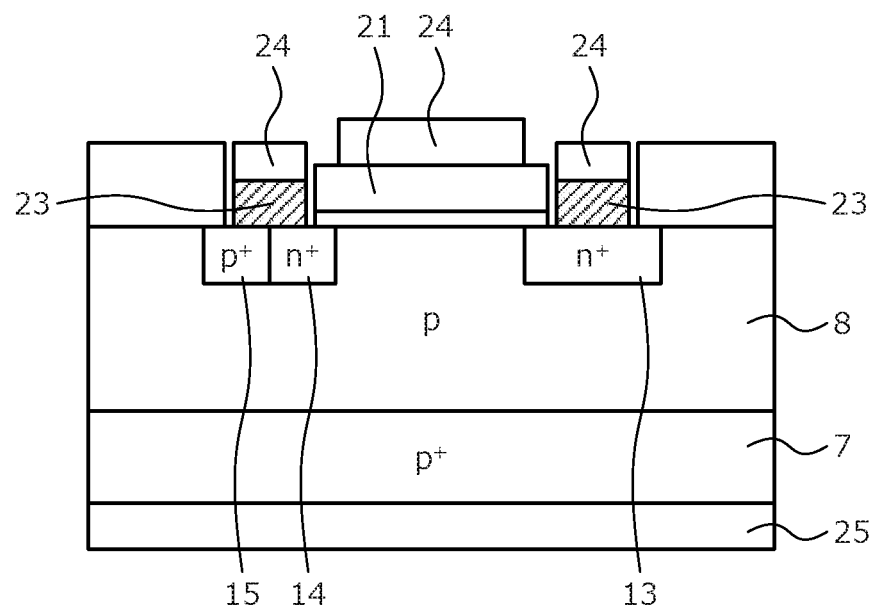

Next, as depicted in FIG. 15, in the tenth process, aluminum is vapor-deposited to a thickness of 300 nanometers on the surface to form pad electrodes 24 on the gate electrode 21 and the reactive layers 23 by photolithography and phosphoric acid (H$_3$PO$_4$) etching while aluminum is vapor-deposited to a thickness of 100 nanometers on the back surface to form a rear electrode 25.

Figure 16:
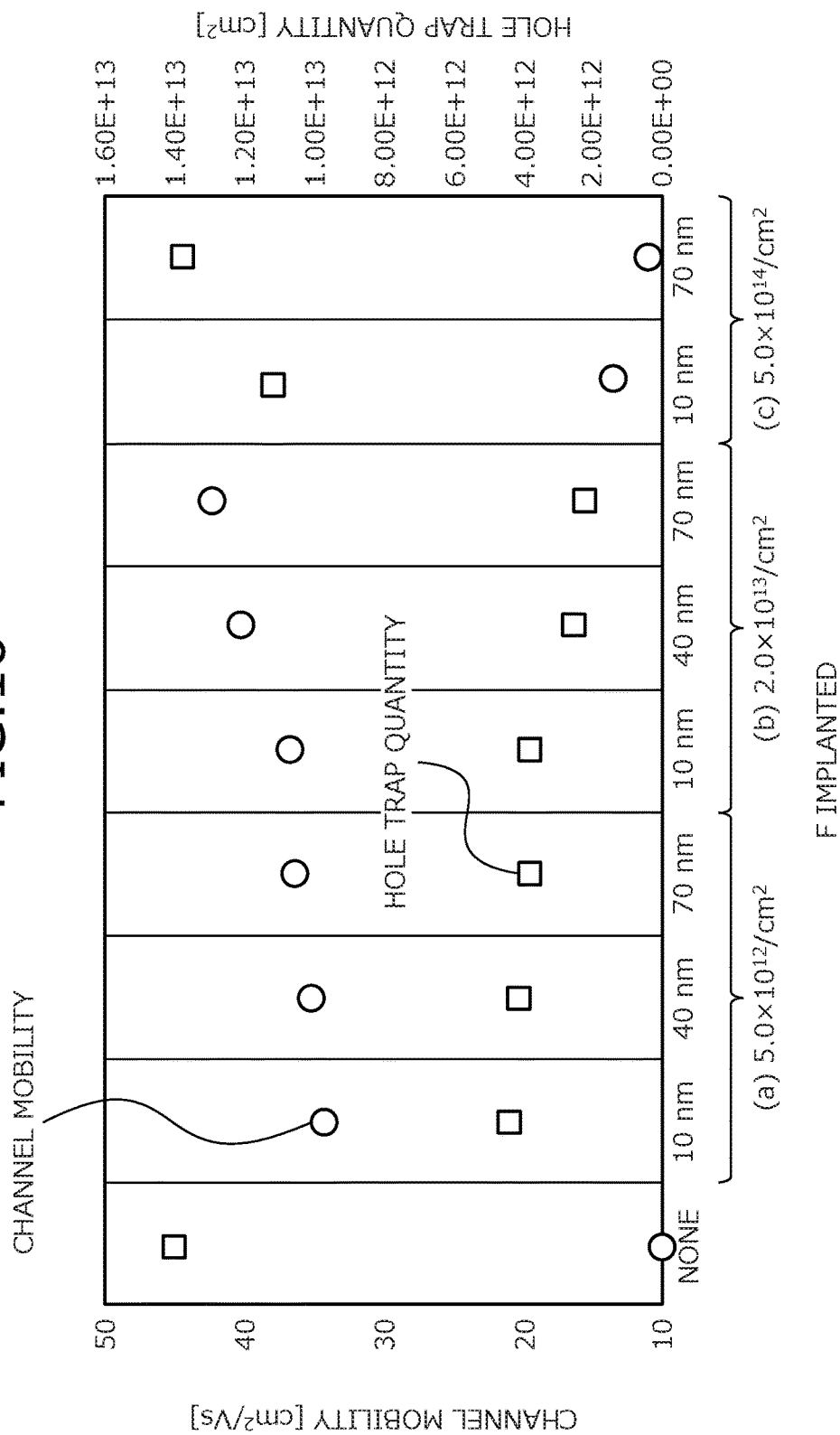
FIG. 16 is a diagram depicting channel mobilities and quantities of hole traps obtained from respective measurement results of the MOSFET according to the first example and MOSFETs fabricated for comparison.

A SiC MOSFET for which only oxidation was performed in an atmosphere containing dry oxygen without performing the fluorine ion implantation at the process 6 in the first example, and a SiC MOSFET for which the implantation at the process 6 was performed under conditions where the acceleration energy was 50 keV and the dose was $5.0 \times 10^{14}$/cm$^2$ were fabricated as comparative examples. FIG. 16 is a diagram depicting the channel mobilities and the quantities of hole traps obtained from respective measurement results of the MOSFET according to the first example and the MOSFETs fabricated for comparison.

In FIG. 16, "none" represents the channel mobility and the quantity of hole traps in the comparative example in which fluorine was not implanted. Further, (a) represents the channel mobilities and the quantities of hole traps in an example in which fluorine was implanted at a dose of $5.0 \times 10^{12}$/cm$^2$, (b) represents the channel mobilities and the quantities of hole traps in an example in which fluorine was implanted at a dose of $2.0 \times 10^{13}$/cm$^2$, and (c) represents the channel mobilities and the quantities of hole traps in an example in which fluorine was implanted at a dose of $5.0 \times 10^{14}$/cm$^2$. The channel mobilities and the quantities of hole traps were measured in cases where the thickness of the insulating film 3 was 10, 40, or 70 nanometers for each of the conditions (a) and (b) and the channel mobilities and the quantities of hole traps were measured in the cases where the thickness of the insulating film 3 was 10 or 70 nanometers for the condition (c).

As depicted in FIG. 16, it is understood that, when fluorine implantation was performed under the conditions (a) and (b) of the first embodiment, the channel mobilities were increased to a highest value of about 40 cm$^2$/Vs and the quantities of hole traps were greatly reduced to a lowest value of $1.9 \times 10^{12}$/cm$^2$ as compared to the case where no fluorine implantation was performed. It is presumed that these are an effect of termination of dangling bonds present in the interface with fluorine, degradation of compounds of carbon present in the interface with fluorine, and reduction of implantation damage by the sacrificial oxide film, similar to the case of the MOS capacitor.

The channel mobilities and the quantities of hole traps of the MOSFET in which fluorine was implanted under the condition (c) described in Japanese Laid-Open Patent Publication No. H07-240409 were substantially identical to those under the condition of no fluorine implantation. It is presumed that this is because the interface state density in the energy regions near the conduction band and the valence band deteriorates due to the damage caused by the ion implantation.

FIG. 17 is a diagram depicting a difference between the manufacturing method according to the first example and an existing manufacturing method. In the existing manufacturing method, an effect of enhanced oxidation to be used for purposes such as element isolation is obtained by performing implantation under conditions where the acceleration energy is equal to or higher than 50 keV and the dose is equal to or more than $5 \times 10^{14}$/cm$^2$ and thereafter performing thermal oxidation processing. In the present example, when implantation is performed under a condition where the acceleration energy is equal to or lower than 30 keV and the dose is less than $2 \times 10^{13}$/cm$^2$ and then thermal oxidation processing is performed, an effect of interface improvement was obtained. However, when implantation was performed under conditions where the acceleration energy was equal to or higher than 50 keV and the dose was less than $5 \times 10^{14}$/cm$^2$, the effect of interface improvement was not obtained.

By thus performing ion implantation under the conditions where the acceleration energy is equal to or lower than 30 keV and the dose is less than $2 \times 10^{13}$/cm$^2$ and then forming a gate oxide film by thermal oxidation, improvement in the channel mobility and reduction in the quantity of hole traps may be achieved.

Figure 18:
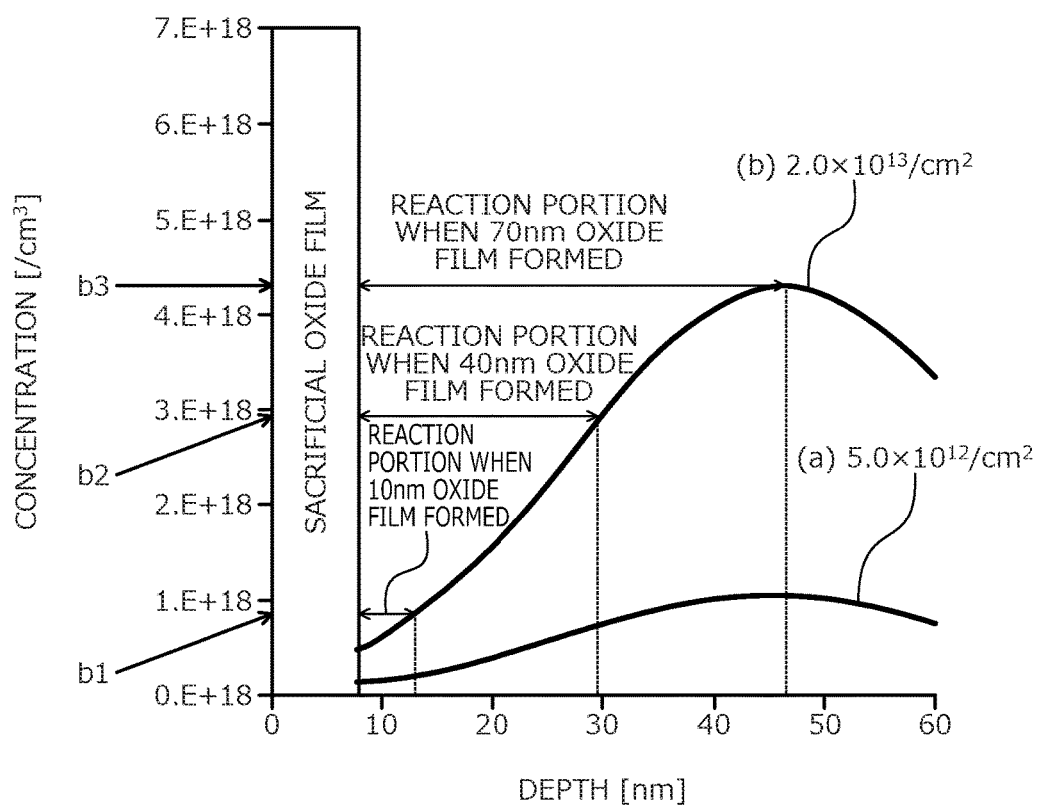
FIG. 18 is a diagram depicting results of a fluorine implantation profile of the present invention, calculated by simulation.

FIG. 18 is a diagram depicting results of a fluorine implantation profile of the present invention, calculated by simulation. In FIG. 18, the vertical axis represents the fluorine concentration where the unit is /cm$^3$ and the horizontal axis represents the depth from the front surface of the silicon carbide substrate where the unit is nanometer. In FIG. 18, (a) indicates a result in a case where ion implantation is performed at a dose of $5 \times 10^{12}$/cm$^2$ and (b) indicates a result in a case where ion implantation is performed at a dose of $2 \times 10^{13}$/cm$^2$. For example, in the case (b), the fluorine concentration is at a position b1 in FIG. 18 when the gate insulating film 20 with a thickness of 10 nanometers is formed; the fluorine concentration is at a position b2 in FIG. 18 when the gate insulating film 20 with a thickness of 40 nanometers is formed; and the fluorine concentration is at a position b3 in FIG. 18 when the gate insulating film 20 with a thickness of 70 nanometers is formed. It is thus seen from FIG. 18 that $2\times10^{17}$ to $4\times10^{18}$/cm$^3$ of fluorine ions are included in the silicon carbide substrate under the conditions applied in the first example.

A second example differs from the first example in the method of forming the gate insulating film 20 depicted in FIG. 12 at the seventh process in the first example. While the fluorine implantation condition is the same as that in the first example, the gate insulating film 20 having a thickness of 50 nanometers is thereafter formed in gas at 1000 degrees C. containing at least moisture. At this time, it suffices that the oxidation temperature is equal to or higher than 800 degrees C. In particular, the oxidation temperature may be, for example, 800 degrees C. to 1100 degrees C. at which the oxidation rate is easily controlled. Other processes are identical to those in the first example. A SiC MOSFET fabricated by this manufacturing method also had identical characteristics to those in the first example.

A third example differs from the first example in the method of forming the gate insulating film 20 depicted in FIG. 12 at the seventh process in the first example. While the fluorine implantation condition is the same as that in the first example, oxynitriding is thereafter performed at 1300 degrees C. for 100 minutes in an atmosphere where the flow ratio between nitrous oxide and nitrogen is 1:5 to form the gate insulating film 20 with a thickness of 50 nanometers. At this time, it suffices that the oxynitriding temperature is equal to or higher than 1000 degrees C. In particular, the oxidation temperature may be, for example, 1200 degrees C. to 1350 degrees C. at which the oxidation rate is easily controlled. Other processes are identical to those in the first example. A SiC MOSFET fabricated by this manufacturing method also had identical characteristics to those in the first example.

A fourth example differs from the first example in the method of forming the gate insulating film 20 depicted in FIG. 12 at the seventh process in the first example. While the fluorine implantation condition is the same as that in the first example, oxynitriding is thereafter performed at 1200 degrees C. for 200 minutes in an atmosphere where the flow ratio between nitric oxide and nitrogen is 1:10 to form the gate insulating film 20 with a thickness of 50 nanometers. At this time, it suffices that the oxynitriding temperature is equal to or higher than 1000 degrees C. In particular, the oxynitriding temperature may be, for example, 1200 degrees C. to 1350 degrees C. at which the oxidation rate is easily controlled. Other processes are identical to those in the first example. A SiC MOSFET fabricated by this manufacturing method also had identical characteristics to those in the first example.

A fifth example differs from the first example in the method of forming the gate insulating film 20 depicted in FIG. 12 at the seventh process in the first example. After an insulating film with a film thickness of nearly 40 nanometers is formed by a deposition method, heat treatment is performed for 10 minutes in an atmosphere at 1200 degrees C. containing dry oxygen to form the gate insulating film 20 of a total thickness of about 50 nanometers. The deposition method of an insulating film includes a method of using silane (SiH$_4$) or TEOS (tetraethoxysilane) (C$_8$H$_{20}$O$_4$Si) in the CVD method although not particularly limited thereto. A heat treatment atmosphere after the deposition and other processes are identical to those in the first example. A SiC MOSFET fabricated by this manufacturing method also had identical characteristics to those in the first example.

A sixth example differs from the first example in the method of forming the gate insulating film 20 depicted in FIG. 12 at the seventh process in the first example. After an insulating film having a film thickness of nearly 40 nanometers is formed by a deposition method, heat treatment is performed for 5 minutes in an atmosphere at 1000 degrees C. containing at least moisture to form the gate insulating film 20 of a total thickness of about 50 nanometers. The deposition method of an insulating film includes a method of using silane or TEOS (tetraethoxysilane) in the CVD method although not particularly limited thereto. A heat treatment atmosphere after the deposition and other processes are identical to those in the first example. A SiC MOSFET fabricated by this manufacturing method also had identical characteristics to those in the first example.

A seventh example differs from the first example in the method of forming the gate insulating film 20 depicted in FIG. 12 at the seventh process in the first example. After an insulating film with a film thickness of nearly 40 nanometers is formed by a deposition method, heat treatment is performed for 20 minutes in an atmosphere at 1300 degrees C. containing nitrous oxide and nitrogen to form the gate insulating film 20 of a total thickness of about 50 nanometers. The deposition method of an insulating film includes a method of using silane or TEOS (tetraethoxysilane) in the CVD method although not particularly limited thereto. A heat treatment atmosphere after the deposition and other processes are identical to those in the first example. A SiC MOSFET fabricated by this manufacturing method also had identical characteristics to those in the first example.

An eighth example differs from the first example in the method of forming the gate insulating film 20 depicted in FIG. 12 at the seventh process in the first example. After an insulating film with a film thickness of nearly 40 nanometers is formed by a deposition method, heat treatment is performed for 40 minutes in an atmosphere at 1300 degrees C. containing nitrous oxide and nitrogen to form the gate insulating film 20 of a total thickness of about 50 nanometers. The deposition method of an insulating film includes a method of using silane or TEOS (tetraethoxysilane) in the CVD method although not particularly limited thereto. A heat treatment atmosphere after the deposition and other processes are identical to those in the first example. A SiC MOSFET fabricated by this manufacturing method also had identical characteristics to those in the first example.

Figure 19:
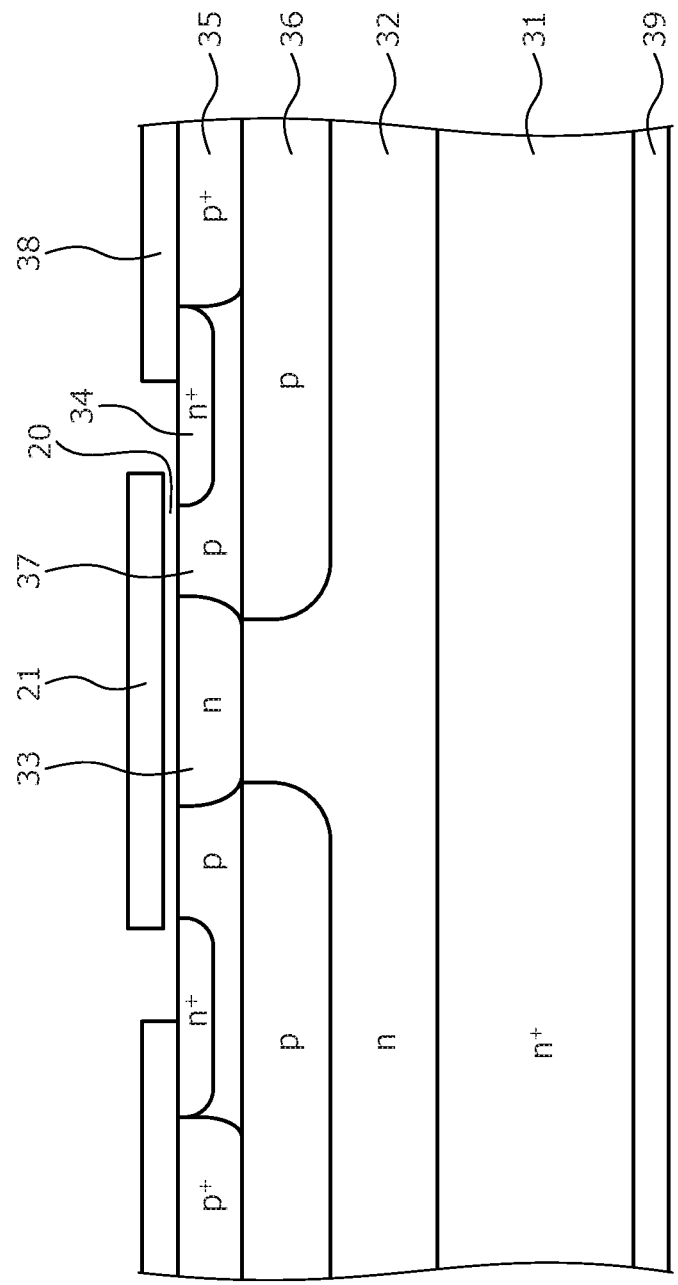
FIG. 19 is a cross-sectional view depicting an example of a vertical MOSFET according to the present invention.

FIG. 19 is a cross-sectional view depicting an example of a vertical MOSFET according to the present invention. As depicted in FIG. 19, the vertical MOSFET has an n-type epitaxial layer 32 formed on the front surface of an n$^+$-type silicon carbide substrate 31.

The n-type epitaxial layer 32 has an impurity concentration lower than that of the n$^+$-type silicon carbide substrate 31. Plural p-type regions 36 are selectively formed in an inner part of the n-type epitaxial layer 32. The p-type regions 36 are exposed on a surface on a first side of the n-type epitaxial layer 32 opposite a second side of the n-type epitaxial layer 32 facing the n$^+$-type silicon carbide substrate 31. A p-type SiC layer 37 having a lower concentration than the p-type regions 36 is formed on the surfaces of the n-type epitaxial layer 32 and the p-type regions 36. An n-type region 33 that penetrates the p-type SiC layer 37 in the depth direction and reaches the n-type epitaxial layer 32 is formed in the p-type SiC layer 37 in the n-type epitaxial layer 32 where the p-type regions 36 are not formed. The n-type epitaxial layer 32 and the n-type region 33 are an n-type drift region. In one embodiment, the impurity concentration of the n-type region 33 may be higher than that of the n-type epitaxial layer 32.

An n+-type source region 34 and a p+-type contact region 35 are formed to be adjacent to each other in each portion of the p-type SiC layer 37. The n+-type source region 34 and the p+-type contact region 35 are exposed on a surface on a first side of the p-type SiC layer 37 opposite a second side of the p-type SiC layer 37 facing the p-type regions 36. The n+-type source region 34 is formed apart from the n-type region 33. The p+-type contact region 35 is positioned on a first side of the n+-type source region 34 opposite a second side of the n+-type source region 34 facing toward the n-type region 33. The impurity concentration of the p+-type contact region 35 is higher than that of the p-type SiC layer 37. A portion of the p-type SiC layer 37 other than the n+-type source region 34, the p+-type contact region 35, and the n-type region 33 forms a p-type base region along with the p-type regions 36.

A source electrode 38 is formed on the surfaces of the n+-type source regions 34 and the adjacent p+-type contact region 35. The gate electrode 21 is formed on the surfaces of the p-type SiC layer 37 and the n-type region 33 between the adjacent n+-type source regions 34, with the gate insulating film 20 interposed therebetween. The gate electrodes 21 are electrically insulated from the source electrodes 38 by an interlayer insulating film (not depicted). A drain electrode 39 that is in contact with the n+-type silicon carbide substrate 31 is formed on the back surface of the n+-type silicon carbide substrate 31. A gate insulating film identical to those in the first to eighth examples was formed in this vertical MOSFET, and accordingly a result of the interface state density identical to those in the first to eighth examples was obtained.

While the (000-1) substrate of a 4H—SiC crystal structure (0 to 8-degree off substrate) is used in the examples described above, identical effects may be obtained with a (11-20) substrate of a 4H—SiC crystal structure.

As described above, with the silicon carbide semiconductor device according to the embodiment, fluorine ions are implanted in the silicon carbide substrate. The fluorine terminates dangling bonds in an interface, which are reported as a factor of the interface state, and further removes compounds of carbon segregated in the interface. Accordingly, the interface state between a silicon carbide layer and a silicon dioxide gate insulating film may be reduced. Therefore, the silicon carbide semiconductor device according to the embodiment may enhance the carrier mobility and reduce fluctuation in the threshold voltage.

Furthermore, the concentration of fluorine in the silicon carbide substrate is $2\times10^{17}$ to $4\times10^{18}/cm^3$. This concentration of fluorine enables improvement of an interface between a silicon carbide layer and a silicon dioxide gate insulating film, and achieves an improvement in channel mobility and a reduction in the quantities of hole traps.

While the present invention has been described using the MOS capacitor, the lateral MOSFET, and the vertical MOSFET using a p+-type semiconductor substrate as examples of a silicon carbide MOSFET, the present invention is not limited hereto. The present invention may also be applied to semiconductor devices having other high breakdown voltage structures or semiconductor devices having a trench gate or complicated MOS gate structure, and these semiconductor devices may also provide identical effects. Accordingly, the present invention is further applicable to a method of manufacturing various types of semiconductor devices without departing from the scope of the invention described in the claims.

According to the silicon carbide semiconductor device and the method of manufacturing a silicon carbide semiconductor device of the present invention, effects are obtained where an interface state density between silicon carbide and a silicon dioxide gate insulating film is reduced more to increase the carrier mobility and reduce fluctuation in a threshold voltage.

As described, the silicon carbide semiconductor device and the method of manufacturing a silicon carbide semiconductor device according to the present invention are useful for, for example, high-voltage semiconductor devices used in power converting equipment and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
   a silicon carbide semiconductor substrate; and
   an insulating film formed on a front surface of the silicon carbide semiconductor substrate, wherein
   the silicon carbide semiconductor substrate has fluorine implanted therein, a concentration of which is in a range of $2\times10^{17}/cm^3$ to $4\times10^{18}/cm^3$, a distribution of the concentration having a peak thereof located at a position below the front surface of the substrate in a depth direction of the silicon carbide semiconductor device.

2. A method of manufacturing a silicon carbide semiconductor device, the method comprising:
   providing a silicon carbide semiconductor substrate;
   forming an oxide film on a front surface of the silicon carbide semiconductor substrate, and removing a portion of the oxide film to expose the silicon carbide semiconductor substrate;
   implanting fluorine ions in the front surface of the silicon carbide semiconductor substrate through the removed portion of the oxide film;
   removing the oxide film after the fluorine ions are implanted; and
   forming an insulating film on the front surface of the silicon carbide semiconductor substrate after the oxide film is removed.

3. The method according to claim 2, wherein the forming the oxide film includes forming, on the front surface of the silicon carbide semiconductor substrate, a silicon dioxide film having a film thickness in a range of 5 nanometers to 15 nanometers.

4. The method according to claim 2, wherein the implanting the fluorine ions includes implanting the fluorine ions until a concentration of fluorine in the silicon carbide semiconductor substrate is in a range of $2\times10^{17}/cm^3$ to $4\times10^{18}/cm^3$.

5. The method according to claim 2, wherein the forming the insulating film includes forming a silicon dioxide film on the front surface of the silicon carbide semiconductor substrate after the oxide film is removed.

6. The method according to claim 5, wherein the forming the silicon dioxide film includes forming the silicon dioxide film by thermal oxidization in a dry oxygen atmosphere containing no moisture.

7. The method according to claim 5, wherein the forming the silicon dioxide film includes forming the silicon dioxide film by thermal oxidation in gas containing at least moisture.

8. The method according to claim 5, wherein the forming the silicon dioxide film includes forming the silicon dioxide film by thermal oxynitriding in an atmosphere containing at least one type of gas among nitric oxide gas, nitrous oxide gas and nitrogen dioxide gas.

9. The method according to claim 5, wherein the forming the silicon dioxide film includes forming the silicon dioxide film by chemical vapor deposition.

10. The method according to claim 9, wherein the forming the insulating film further includes heat treating the silicon carbide semiconductor substrate in a dry oxygen atmosphere containing no moisture, after the silicon dioxide film is deposited.

11. The method according to claim 9, wherein the forming the insulating film further includes heat treating the silicon carbide semiconductor substrate with gas containing at least moisture, after the silicon dioxide film is deposited.

12. The method according to claim 9, wherein the forming the insulating film further includes heat treating the silicon carbide semiconductor substrate in an atmosphere containing at least one type of gas among nitric oxide gas, nitrous oxide gas and nitrogen dioxide gas, after the silicon dioxide film is deposited.

* * * * *